(12) United States Patent
Lee et al.

(10) Patent No.: US 12,416,095 B2
(45) Date of Patent: Sep. 16, 2025

(54) INGOT GROWTH APPARATUS

(71) Applicants: HANWHA SOLUTIONS CORPORATION, Seoul (KR); HANWHA CORPORATION, Seoul (KR)

(72) Inventors: Young Min Lee, Seoul (KR); Kyung Seok Lee, Seoul (KR); Jin Sung Park, Seoul (KR); Dong Woo Bae, Seoul (KR)

(73) Assignees: HANWHA SOLUTIONS CORPORATION, Seoul (KR); HANWHA CORPORATION, Seoul (KR)

( * ) Notice: Subject to any disclaimer, the term of this patent is extended or adjusted under 35 U.S.C. 154(b) by 176 days.

(21) Appl. No.: 18/028,609

(22) PCT Filed: Sep. 3, 2021

(86) PCT No.: PCT/KR2021/011953
§ 371 (c)(1),
(2) Date: Mar. 27, 2023

(87) PCT Pub. No.: WO2022/065740
PCT Pub. Date: Mar. 31, 2022

(65) Prior Publication Data
US 2024/0076798 A1    Mar. 7, 2024

(30) Foreign Application Priority Data
Sep. 28, 2020    (KR) .......................... 10-2020-0126319

(51) Int. Cl.
*C30B 15/18*    (2006.01)
*C30B 29/06*    (2006.01)

(52) U.S. Cl.
CPC .............. *C30B 15/18* (2013.01); *C30B 29/06* (2013.01)

(58) Field of Classification Search
CPC ......... C30B 15/10; C30B 15/14; C30B 15/18; C30B 29/06
See application file for complete search history.

(56) References Cited

U.S. PATENT DOCUMENTS

| | | | | |
|---|---|---|---|---|
| 5,134,261 A | * | 7/1992 | Larkin | ..................... H05B 6/24 |
| | | | | 219/649 |
| 2006/0050763 A1 | * | 3/2006 | Lazor | ..................... F27B 14/14 |
| | | | | 373/156 |

(Continued)

FOREIGN PATENT DOCUMENTS

| | | |
|---|---|---|
| CN | 201241194 Y | 5/2009 |
| CN | 102628184 A | 8/2012 |

(Continued)

OTHER PUBLICATIONS

International Search Report for PCT/KR2021/011953 dated Dec. 27, 2021.

(Continued)

*Primary Examiner* — Hua Qi
(74) *Attorney, Agent, or Firm* — Sughrue Mion, PLLC

(57) ABSTRACT

An ingot growth apparatus is disclosed. The ingot growth apparatus according to an embodiment of the present invention may comprise: a growth furnace having a main crucible which is disposed inside the growth furnace and in which molten silicon is held in order to grow an ingot; a susceptor formed to surround the outer surface of the main crucible and heating the main crucible; a heater formed to surround the outer surface of the susceptor and including a coil which is supplied with power to generate a magnetic field and heats the susceptor by electromagnetic induction from the mag- (Continued)

netic field; and a heat insulation member disposed between the coil and the susceptor.

11 Claims, 14 Drawing Sheets

(56) References Cited

U.S. PATENT DOCUMENTS

| | | | | |
|---|---|---|---|---|
| 2012/0304697 A1* | 12/2012 | Dughiero | ............ | B22D 27/045 65/355 |
| 2016/0230307 A1* | 8/2016 | Stoddard | ............... | C30B 11/006 |
| 2021/0054527 A1* | 2/2021 | Wang | ...................... | C30B 15/00 |

FOREIGN PATENT DOCUMENTS

| | | | |
|---|---|---|---|
| CN | 105276980 | A | 1/2016 |
| CN | 108409129 | A | 8/2018 |
| CN | 216237375 | U | 4/2022 |
| JP | 10-310487 | A | 11/1998 |
| JP | 2017-200868 | A | 11/2017 |
| KR | 10-2001-0020315 | A | 3/2001 |
| KR | 10-0841930 | B1 | 6/2008 |
| KR | 10-2015-0049327 | A | 5/2015 |
| KR | 10-2015-0053416 | A | 5/2015 |
| KR | 20180106352 | A * | 10/2018 |
| KR | 10-2013784 | B1 | 9/2019 |
| KR | 10-2271716 | B1 | 7/2021 |
| TW | 201207170 | A | 2/2012 |

OTHER PUBLICATIONS

Communication issued May 31, 2024 in Chinese Application No. 202011404804.X.

Communication dated Mar. 28, 2025 in Chinese Application No. 202011404804.X.

* cited by examiner

INGOT GROWTH APPARATUS

CROSS-REFERENCE TO RELATED APPLICATION

This application claims priority to and the benefit of Korean Patent Application No. 10-2020-0126319, filed on Sep. 28, 2020, the disclosure of which is incorporated herein by reference in its entirety.

TECHNICAL FIELD

The present invention relates to an apparatus for growing an ingot.

BACKGROUND ART

Single crystal silicon is used as a basic material for most solar light and semiconductor components, and these materials are manufactured as single crystals with high purity, and one of the manufacturing methods thereof is the Czochralski method.

In the Czochralski crystallization method, silicon is placed into a crucible, and the crucible is heated to melt the silicon. In addition, when a single crystal seed is pulled upward while rotating in a state of being in contact with the molten silicon, an ingot having a predetermined diameter is grown.

The continuous Czochralski method (CCz), which is one of the Czochralski methods, is a method of continuously growing an ingot while supplementing the consumed molten silicon by continuously injecting solid polysilicon or molten silicon into the crucible.

In order to grow an ingot through the continuous Czochralski method (CCz), it is important to secure the efficiency of power energy consumed to heat a crucible.

DISCLOSURE

Technical Problem

According to an exemplary embodiment of the present invention, it is directed to providing an apparatus for growing an ingot that improves the efficiency of power energy for heating a crucible.

Technical Solution

The apparatus for growing an ingot according to an exemplary embodiment of the present invention may include a growth furnace having a main crucible which is disposed inside the growth furnace and in which molten silicon is held in order to grow an ingot; a susceptor which is formed to surround the outer surface of the main crucible and heats the main crucible; a heater which is formed to surround the outer surface of the susceptor and includes a coil which is supplied with power to generate a magnetic field and heats the susceptor by electromagnetic induction from the magnetic field; and a heat insulation member which is disposed between the coil and the susceptor.

In this case, the heat insulation member may be made of a plate-shaped member which is formed on the outer side surface of the susceptor, and wherein one side surface of the heat insulating member in the transverse direction and the other side surface of the heat insulating member in the transverse direction may be disposed to face each other and be spaced apart from one side of the outer side surface of the susceptor.

In this case, a non-magnetic material may be provided between one side surface of the heat insulating member in the transverse direction and the other side surface of the heat insulation member in the transverse direction.

In this case, the heater further may include a shield which is formed to surround the outer side surface of the coil and blocks exposure of the coil to the inner space of the growth furnace.

In this case, the heat insulation member may be disposed on the upper side surface of the shield and may be formed to partially cover the upper side surface of the shield.

In this case, the shield may be made of ceramic.

In this case, the heat insulation member may be made of carbon fiber.

In this case, the apparatus for growing an ingot may further include a cover member which blocks exposure of the heat insulation member to the inner space of the growth furnace.

In this case, the cover member may be made of a ceramic material.

In this case, the cover member may include at least one of alumina ($Al_2O_3$), zirconia ($ZrO_2$), silica ($SiO_2$) or silicon nitride ($Si_3N_4$).

In this case, the coil may include a cooling pipe through which cooling water flows inside the coil.

In this case, the thickness of the heat insulation member may correspond to twice the thickness of the susceptor.

Advantageous Effects

In the apparatus for growing an ingot according to an exemplary embodiment of the present invention, since the heat insulation member blocks the heat of a susceptor, which has been heated, from being transferred to a coil, it is possible to prevent the coil from being damaged by the heat.

In addition, since the heat insulation member blocks the heat of a susceptor from being transferred to cooling water flowing inside the coil, it is possible to increase the efficiency of power energy for heating the susceptor.

Figure 1:
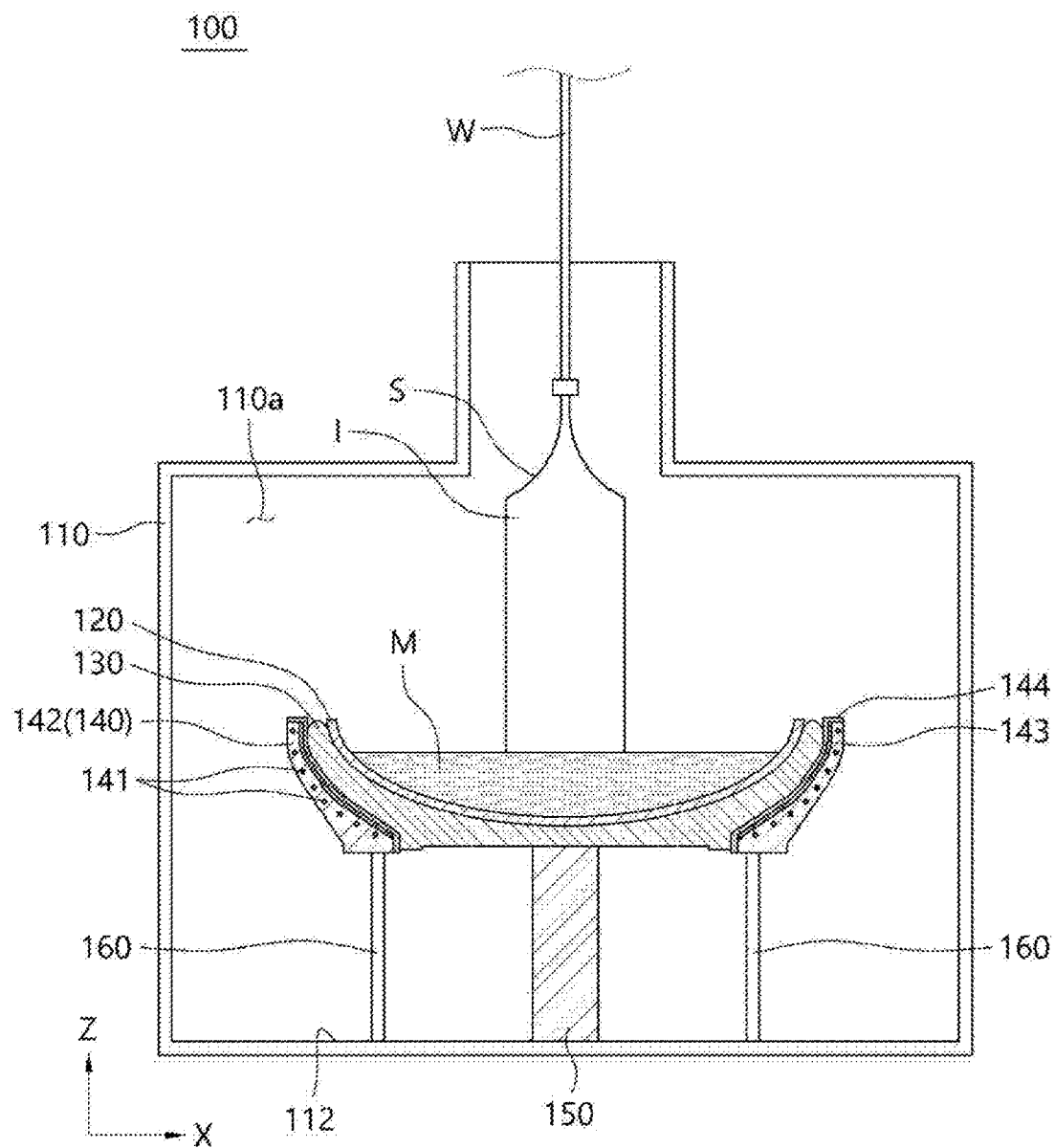
FIG. 1 is a view schematically showing the apparatus for growing an ingot according to an exemplary embodiment of the present invention.

100: Apparatus for growing ingot
110: Growth furnace
120: Main crucible
130: Susceptor
140: Heater
141: Coil
143: Heat insulation member

MODES OF THE INVENTION

Terms and words used in the present specification and claims should not be construed as limited to their usual or dictionary definition, and they should be interpreted as a meaning and concept consistent with the technical idea of the present invention based on the principle that inventors may appropriately define the terms and concept in order to describe their own invention in the best way.

Accordingly, the exemplary embodiments described in the present specification and the configurations shown in the drawings correspond to preferred exemplary embodiments of the present invention, and do not represent all the technical spirit of the present invention, and thus, the configurations may have various examples of equivalent and modification that can replace them at the time of filing the present invention.

It is understood that the terms "include" or "have", when used in the present specification, are intended to describe the presence of stated features, integers, steps, operations, elements, components and/or a combination thereof but do not preclude the possibility of the presence or addition of one or more other features, integers, steps, operations, elements, components or a combination thereof.

The presence of an element in/on "front", "rear", "upper or above or top" or "lower or below or bottom" of another element includes not only being disposed in/on "front", "rear", "upper or above or top" or "lower or below or bottom" directly in contact with other elements, but also cases in which another element being disposed in the middle, unless otherwise specified. In addition, unless otherwise specified, that an element is "connected" to another element includes not only direct connection to each other but also indirect connection to each other.

Hereinafter, the apparatus for growing an ingot according to an exemplary embodiment of the present invention will be described with reference to the drawings. In the present specification, in terms of describing the apparatus for growing an ingot according to an exemplary embodiment of the present invention, the configurations that are not related to the contents of the present invention are not illustrated in detail or omitted for the sake of simplification of the drawings, and the apparatus for growing an ingot according to the present invention will be described by mainly focusing on the contents that are related to the spirit of the invention.

In the present specification, the arrow direction of the Z-axis is referred to as an upward direction of the growth furnace. The downward direction means a direction opposite to the upward direction.

FIG. 1 is a view schematically showing the apparatus for growing an ingot according to an exemplary embodiment of the present invention.

Referring to FIG. 1, the apparatus for growing an ingot 100 according to an exemplary embodiment of the present invention may include a growth furnace 110, a main crucible 120, a susceptor 130, a heater 140 and a heat insulation member 143.

The growth furnace 110 has an internal space 110a which is maintained in a vacuum state, and is formed such that an ingot I is grown in the internal space 110a. A main crucible 120 to be described below is disposed in the inner space 110a.

The growth furnace 110 is provided with a vacuum pump (not illustrated) and an inert gas supply part (not illustrated). The vacuum pump may maintain the internal space 110a in a vacuum atmosphere. In addition, the inert gas supply part supplies inert gas to the internal space 110a. The inert gas may be, for example, argon (Ar).

The main crucible 120 is accommodated in the inner space 110a of the growth furnace 110. The main crucible 120 may accommodate molten silicon M. The main crucible 120 is generally formed in the shape of a reverse dome. In addition, the main crucible 120 is not limited to being formed in the shape of a reverse dome, and may be formed in various shapes such as a cylindrical shape.

In addition, the main crucible 120 is made of a quartz material. However, the main crucible 120 is not limited to being made of a quartz material, and may include various materials that have heat resistance at a temperature of about 1,400° C. or higher and withstand a sudden change in temperature.

In addition, while a single crystal seed S is in contact with the molten silicon M accommodated in the main crucible 120, when a wire W which is connected to the upper side of the growth furnace 110 pulls up the single crystal seed S in the upward direction (Z axis), an ingot I having a predetermined diameter is grown along the pulling direction (Z axis) of the ingot I.

In addition, the growth furnace 110 is provided with a preliminary melting part (not illustrated) for receiving and melting a solid silicon raw material. The preliminary melting part supplies the molten silicon to the main crucible 120.

The susceptor 130 surrounds the outer surface of the main crucible 120. The susceptor 130 supports the main crucible 120. The inner surface of the susceptor 130 has a shape corresponding to the outer surface of the main crucible 120. For example, if the main crucible 120 has a reverse dome shape, the susceptor 130 also has a reverse dome shape. The susceptor 130 is made of a graphite material. In addition, the susceptor 130 is not limited to being made of a graphite material, and may include various materials having strong heat resistance and conductor properties.

Accordingly, even if the main crucible 120 is made of a quartz material and deformed at a high temperature, the susceptor 130 surrounds and supports the main crucible 120 so as to maintain a state in which the main crucible 120 receives the molten silicon M.

In addition, a susceptor support part 150 for supporting the susceptor 130 is disposed on the lower side 112 of the growth furnace 110. The upper end of the susceptor support 150 has a shape corresponding to the lower end of the susceptor 130. In addition, while the susceptor support part 150 supports the susceptor 130 at the lower side of the growth furnace 110, the susceptor support part 150 rotates together with the susceptor 130. Accordingly, while the main crucible 120 accommodates the molten silicon M, the main crucible 120 is rotated together with the susceptor 130.

In addition, the growth furnace 110 is provided with a driving part (not illustrated) that provides a rotational force to rotate the susceptor support 150. The susceptor support part 150 is rotatably connected to the driving part. When the driving part receives power and provides a rotational force to the susceptor support part 150, the main crucible 120 is rotated together with the susceptor 130.

In addition, a heater 140 for heating the susceptor 130 is provided in the growth furnace 110. The heater 140 includes a coil 141 for receiving power to generate a magnetic field and a shield 142 for surrounding the coil 141.

The coil 141 is formed to surround the outer surface of the susceptor 130. The coil 141 receives power to generate a magnetic field. In addition, the coil 141 generates a current in the susceptor 130 by electromagnetic induction by a magnetic field. In this case, the current generated in the susceptor 130 is converted into thermal energy. Accordingly, the heater 140 heats the susceptor 130. The heat of the susceptor 130 is conducted to the main crucible 120, and the susceptor 130 heats the main crucible 120.

The shield 142 supports the coil 141 such that the coil 141 is maintained in a certain shape. The shield 142 is made of ceramic. For example, the shield 142 may include at least one of alumina ($Al_2O_3$), zirconia ($ZrO_2$), silica ($SiO_2$) or silicon nitride ($Si_3N_4$).

The shield 142 blocks the coil from being exposed to the inner space 110a of the growth furnace 110. Accordingly, the shield 142 blocks the coil 141 from being exposed to the inner space 110a of the growth furnace 110 such that when the coil 141 receives power to form a magnetic field, it is possible to prevent an arc discharge from occurring due to plasma phenomenon in the vacuum state or an arc discharge from being generated by the coil 141 coming into contact with inert gas (e.g., argon) which is present in the inner space 110a.

In addition, a heater support part 160 supporting the heater 140 is disposed below the growth furnace 110. The heater support part 160 is generally formed in a cylindrical shape. The susceptor support 150 is disposed inside the heater support part 160 having the cylindrical shape. In addition, the upper end of the heater support part 160 has a shape corresponding to the lower end of the heater 140, and the heater 140 is disposed on the upper end of the heater support part 160.

A heat insulation member 143 is provided between the susceptor 130 and the coil 141 to block the movement of heat. In addition, the heat insulation member 143 is surrounded by the cover member 144 to prevent exposure to the inner space 110a of the growth furnace 110.

The heat insulation member 143 and the cover member will be described in detail below with reference to the drawings.

Figure 2A:
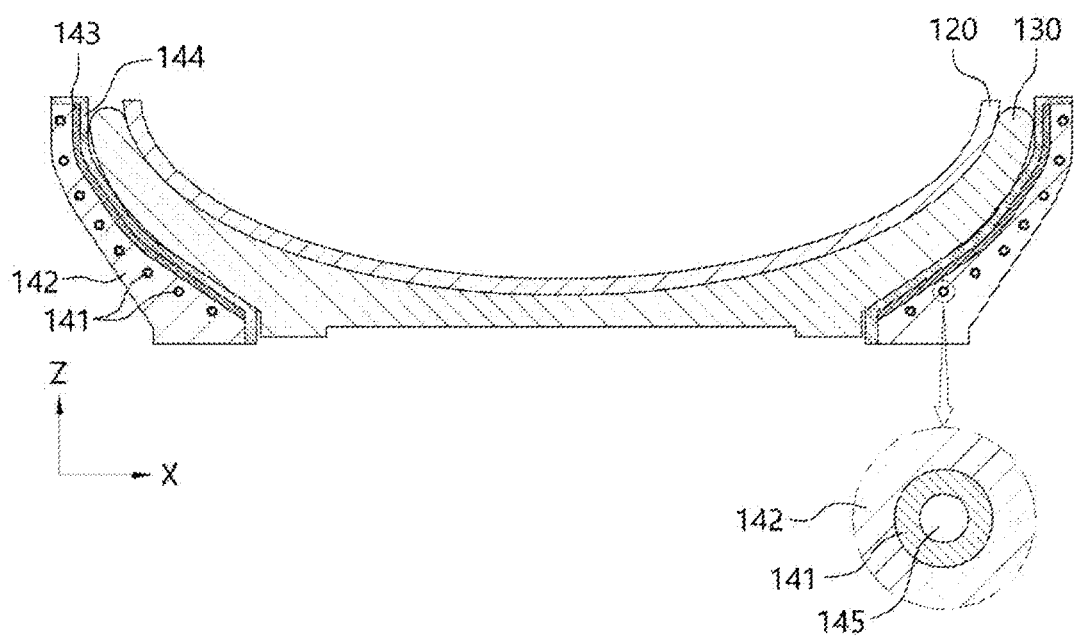
FIG. 2a is a cross-sectional view mainly showing the heater, the heat insulation member and the cover member of FIG. 1.
Figure 2B:
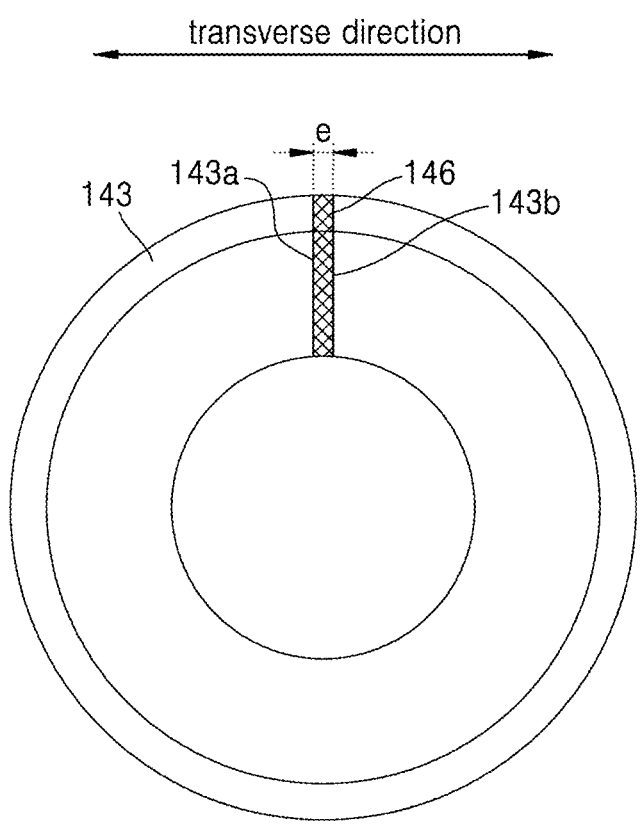
FIG. 2b is a view showing a state in which the heat insulation member of FIG. 1 is viewed from above.

FIG. 2a is a cross-sectional view mainly showing the heater, the heat insulation member and the cover member of FIG. 1, and FIG. 2b is a view showing a state in which the heat insulation member of FIG. 1 is viewed from above.

Referring to FIGS. 2a and 2b, the heat insulation member 143 is disposed on the upper surface of the shield 142 and is formed to partially cover the upper surface of the shield 142. In addition, the heat insulation member 143 is formed to partially surround the outer surface of the susceptor 130. In this case, the heat insulation member 143 may be formed of a plate-shaped member which is disposed between the shield 142 and the susceptor 130.

Meanwhile, a cooling pipe 145 through which cooling water flows is formed inside the coil 141. The temperature of the cooling water of the cooling pipe 145 is approximately 300K. The cooling water flowing along the cooling pipe 145 cools the heat generated from the coil 141.

The heat insulation member 143 blocks the heat of the susceptor 130 from being transferred to the coil 141. In addition, the heat insulation member 143 blocks the heat of the susceptor 130 from being transferred to cooling water flowing inside the coil 141. Accordingly, the heat of the susceptor 130 is transferred to the main crucible 120, thereby increasing the efficiency of power energy for heating the main crucible 120.

As illustrated in FIG. 2b, one side surface 143a of the heat insulation member 143 in the traverse direction and the other side surface 143b of the heat insulation member 143 in the transverse direction are disposed to face each other and be spaced apart from the outer side surface of the susceptor 130. In addition, at least one cut-out area is formed in the heat insulation member 143. That is, the heat insulation member 143 is not formed in a loop shape. Accordingly, one side 143a of the heat insulation member 143 and the other side 143b of the heat insulation member 143 are not electrically connected, and thus, the heat insulation member 143 is prevented from being heated by electromagnetic induction.

In addition, according to various exemplary embodiments of the present invention, the heat insulation member 143 may be provided as a plurality of heat insulation members that are separated from each other by a plurality of cut areas. The plurality of heat insulation members are electrically insulated from each other by the plurality of cut-out areas.

In addition, the heat insulation member 143 is made of carbon fiber. In addition, the heat insulation member 143 is formed in the form of a felt including carbon fibers. In addition, according to various exemplary embodiments of the present invention, the heat insulation member 143 may have a structure in which a felt including carbon fibers is laminated. In addition, according to various exemplary embodiments of the present invention, the heat insulation member 143 may be formed of zirconia ($ZrO_2$) or silica ($SiO_2$) in powder form.

The cover member 144 is formed to surround the heat insulation member 143. In addition, the cover member 144 is formed to cover a portion of the shield 142 adjacent to the heat insulation member 143. In addition, the cover member 144 fills a space between the susceptor 130 and the heat insulation member 143. Accordingly, since the cover member 144 blocks the heat insulation member 143 from being exposed to the inner space 110a (refer to FIG. 1) of the growth furnace 110 (refer to FIG. 1), it is possible to prevent an arc discharge from occurring due to plasma phenomenon in a vacuum state or prevent an arch discharge from being generated by the heat insulation member 143 coming into contact with inert gas which is present in the inner space 110a.

In addition, the cover member 144 is made of ceramic. For example, the cover member 144 is made of any one of alumina ($Al_2O_3$), zirconia ($ZrO_2$), silica ($SiO_2$) or silicon nitride ($Si_3N_4$). In addition, according to various exemplary embodiments of the present invention, the cover member 144 may be made of the same material as the shield 142.

In addition, according to various exemplary embodiments of the present invention, the cover member 144 may be formed of a coating layer to cover a portion of the shield 142 adjacent to the heat insulation member 143 while covering the heat insulation member 143.

A non-magnetic material 146 is provided between the one side surface 143a of the heat insulation member 143 in the transverse direction and the other side surface 143b of the heat insulation member 143 in the transverse direction. The non-magnetic material 143b electrically insulates between one side 143a of the heat insulation member 143 and the other side 143b of the heat insulation member 143.

In addition, the non-magnetic material 146 is made of ceramic. For example, the non-magnetic material 146 is made of any one of alumina ($Al_2O_3$), zirconia ($ZrO_2$), silica ($SiO_2$) or silicon nitride ($Si_3N_4$).

In addition, the distance e between one side 143a of the heat insulation member 143 and the other side 143b of the heat insulation member 143 is approximately 0.5 mm or more. For example, when the distance e is approximately 0.5 mm, the thickness of the non-magnetic material 146 is also 0.5 mm.

In addition, according to various exemplary embodiments of the present invention, a plurality of cut areas may be formed in the heat insulation member 143, and the non-magnetic material 146 may be filled in the plurality of cut areas.

In an exemplary embodiment of the present invention, the thickness t of the heat insulation member is 40 to 60 mm. The thickness t of the heat insulation member will be described in detail later below reference to the drawings.

Figure 3:
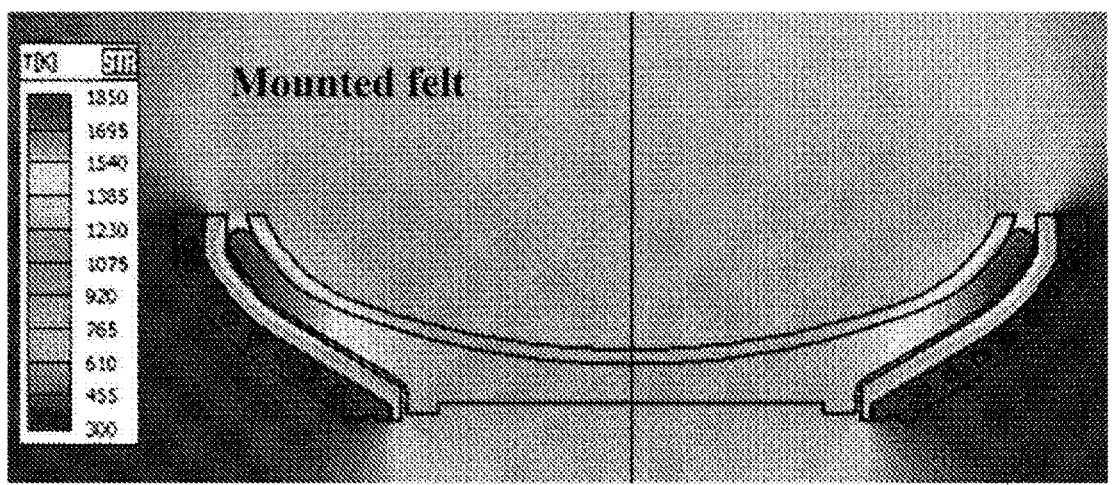
FIG. 3 is a diagram showing the temperature of a hotzone of the apparatus for growing an ingot according to an exemplary embodiment of the present invention through simulation.
Figure 4:
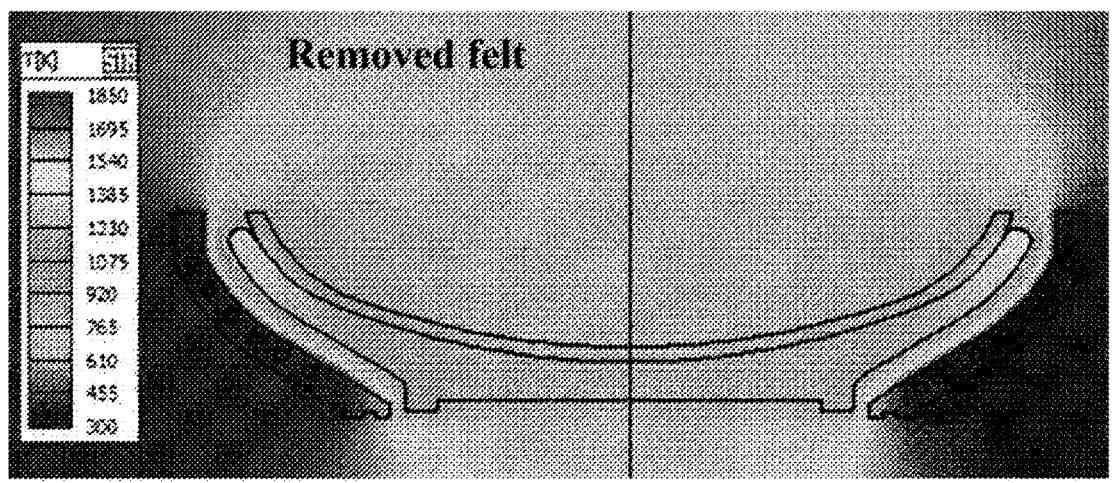
FIG. 4 is a diagram showing the temperature of a hotzone of the apparatus for growing an ingot through simulation, when there is no heat insulation member.

FIG. 3 is a diagram showing the temperature of a hotzone of the apparatus for growing an ingot according to an exemplary embodiment of the present invention through simulation, and FIG. 4 is a diagram showing the temperature of a hotzone of the apparatus for growing an ingot through simulation, when there is no heat insulation member.

A hotzone of the apparatus for growing an ingot 100 (refer to FIG. 1) is defined as an area including the susceptor 130 (refer to FIG. 1) and the surrounding components of the susceptor 130 (refer to FIG. 1).

Referring to FIGS. 3 and 4, the heating performance of the susceptor 130 according to the presence of the heat insulation member 143 (refer to FIG. 2a) will be examined.

When FIG. 3 and FIG. 4 are compared, if the heat insulation member is disposed between the coil and the susceptor, the temperature of the side portion of the susceptor is close to about 1,695° C., but if the heat insulation member is not disposed between the coil and the susceptor, the temperature of the susceptor does not exceed approximately 1,385° C. Since the melting point of silicon corresponds to about 1,414° C., when the heat insulation member is not disposed, more power energy is consumed to increase the temperature of the susceptor.

As such, in the apparatus for growing an ingot according to an exemplary embodiment of the present invention, as the heat insulation member is disposed between the coil and the susceptor, the efficiency of power energy for increasing the temperature of the susceptor is increased.

Figure 5:
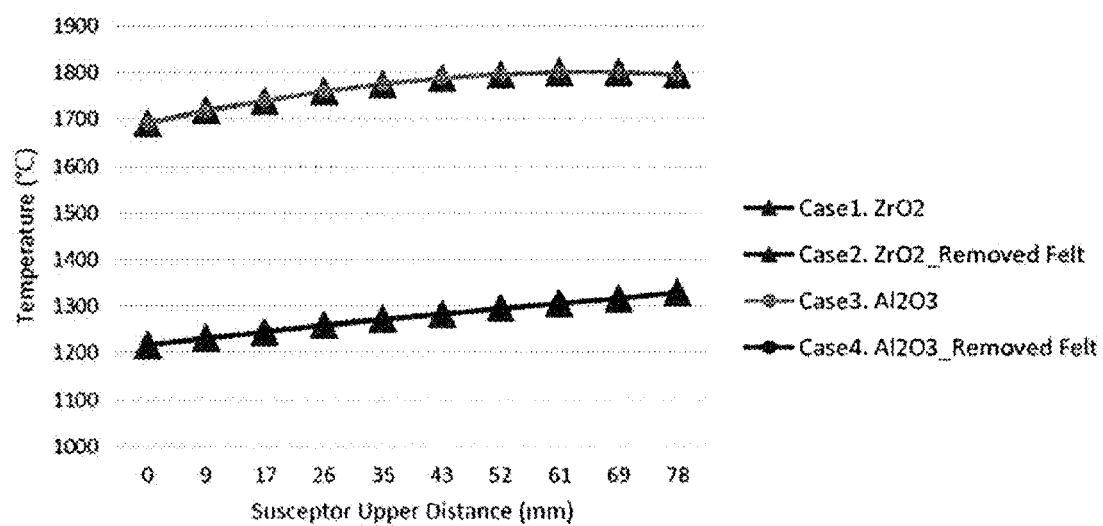
FIG. 5 is a graph showing the temperature of a susceptor according to the material of a shield and the presence of a heat insulation member through simulation.

FIG. 5 is a graph showing the temperature of a susceptor according to the material of a shield and the presence of a heat insulation member through simulation.

Referring to FIG. 5, cases where the material of the shield (e.g., castable) is zirconia ($ZrO_2$) and cases where the material of the shield (e.g., castable) is alumina ($Al_2O_3$) will be compared to examine the effects thereof on the temperature of the susceptor.

In all cases of where the material of the shield (e.g., castable) is zirconia ($ZrO_2$) and cases where the material of the shield (e.g., castable) is alumina ($Al_2O_3$), the temperature distributions according to the distance (Susceptor Upper Distance) from the upper side of the susceptor are similar.

Meanwhile, as shown in FIGS. 3 and 4, when the heat insulation member is not disposed (e.g., $ZrO_2$ Removed Felt, $Al_2O_3$Removed Felt), the temperature of the susceptor is lower than the temperature of the susceptor when the heat insulation member is disposed regardless of the material of the shield.

As such, the heat insulation member of the apparatus for growing an ingot according to an exemplary embodiment of the present invention increases the heat generating performance of the susceptor, thereby reducing the consumption of power energy for heating the susceptor.

Figure 6:
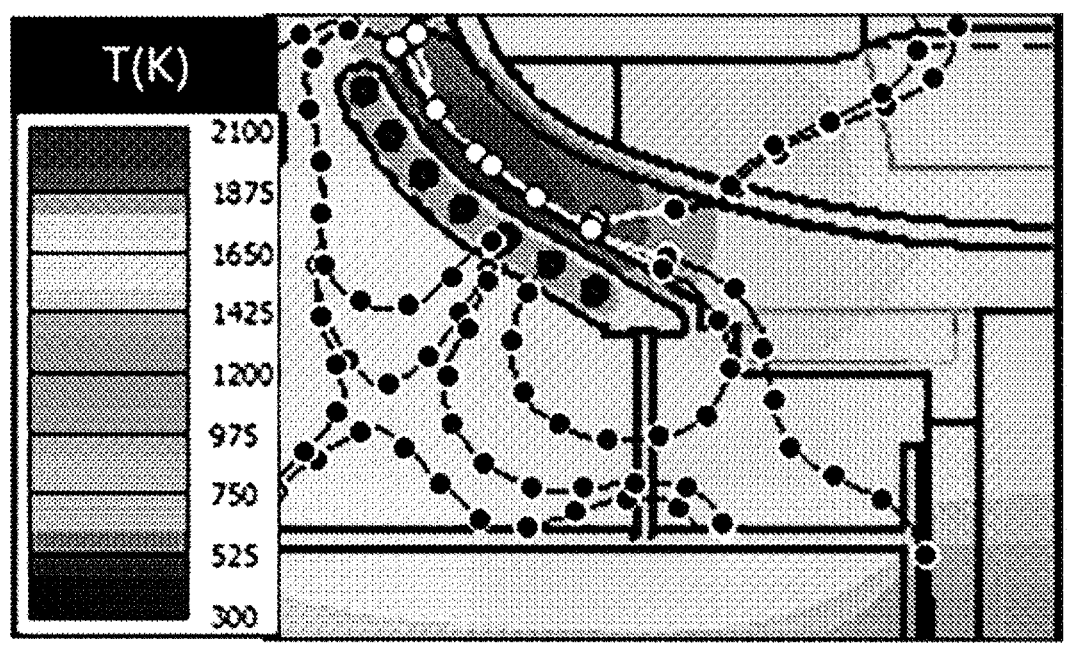
FIGS. 6 to 8 are diagrams showing the susceptor temperature and the ambient temperature of a susceptor according to the distance between the coil and the susceptor.
Figure 7:
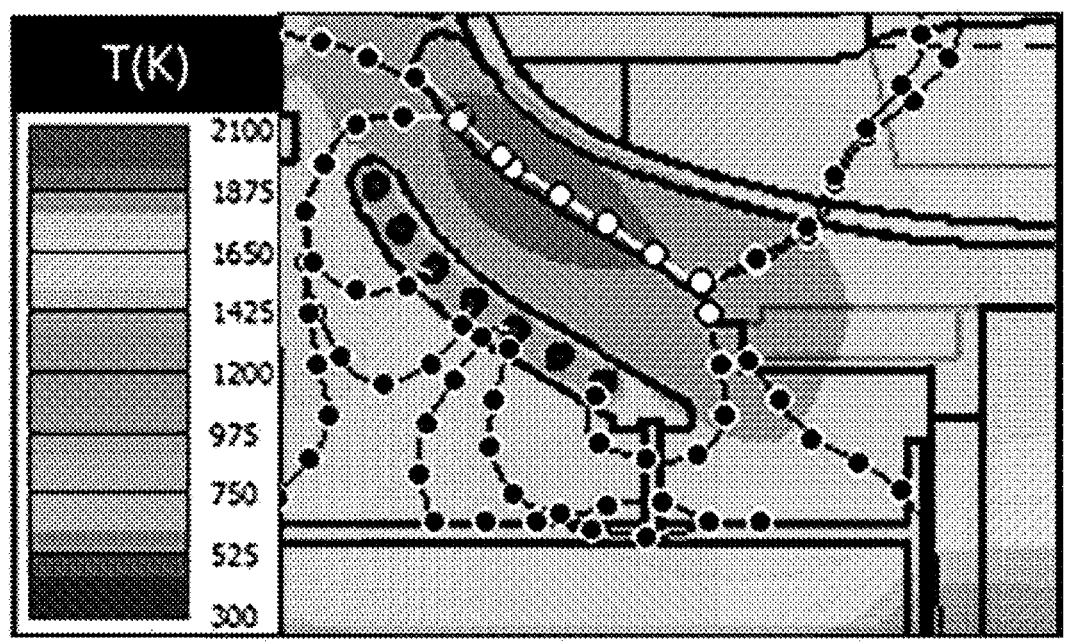
Figure 8:
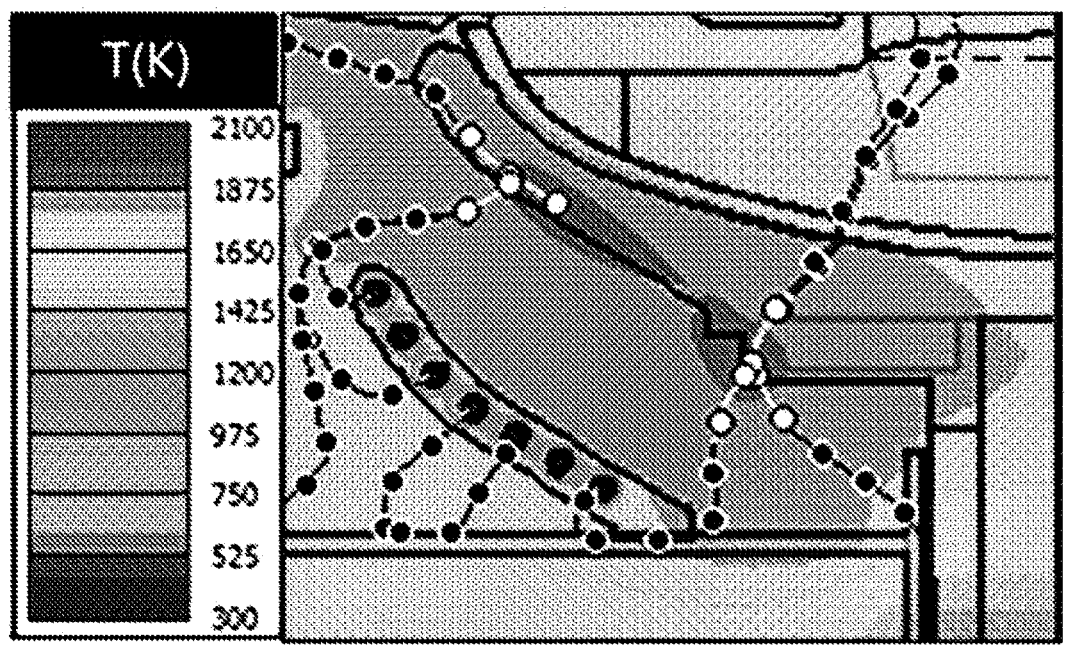

FIGS. 6 to 8 are diagrams showing the susceptor temperature and the ambient temperature of a susceptor according to the distance between the coil and the susceptor.

The coil illustrated in FIG. 6 is disposed to be spaced apart from the susceptor by a first distance, the coil illustrated in FIG. 7 is disposed to be spaced apart from the susceptor by a second distance, and the coil illustrated in FIG. 8 is disposed to be spaced apart from the susceptor by a third distance. The second distance is longer than the first distance, and the third distance is longer than the second distance.

Heat insulation members having the same thickness are disposed between the coils illustrated in FIGS. 6 to 8 and the susceptor.

When FIGS. 6 to 8 are compared, the susceptor illustrated in FIG. 6 generates heat at a higher overall temperature than the susceptors illustrated in FIGS. 7 and 8. This is because, as the distance between the coil and the susceptor increases, the heat of the susceptor is transferred to a space between the coil and the susceptor, and the heat loss of the susceptor increases.

In addition, the power energy for heating the susceptor illustrated in FIG. 6 is 49.75 kW, the power energy for heating the susceptor illustrated in FIG. 7 is 53.47 kW, and the power energy for heating the susceptor illustrated in FIG. 8. is 51.04 kW. As such, when the heat insulation member is disposed between the coil and the susceptor, as the coil approaches the susceptor, power energy for heating the susceptor is reduced.

Figure 9:
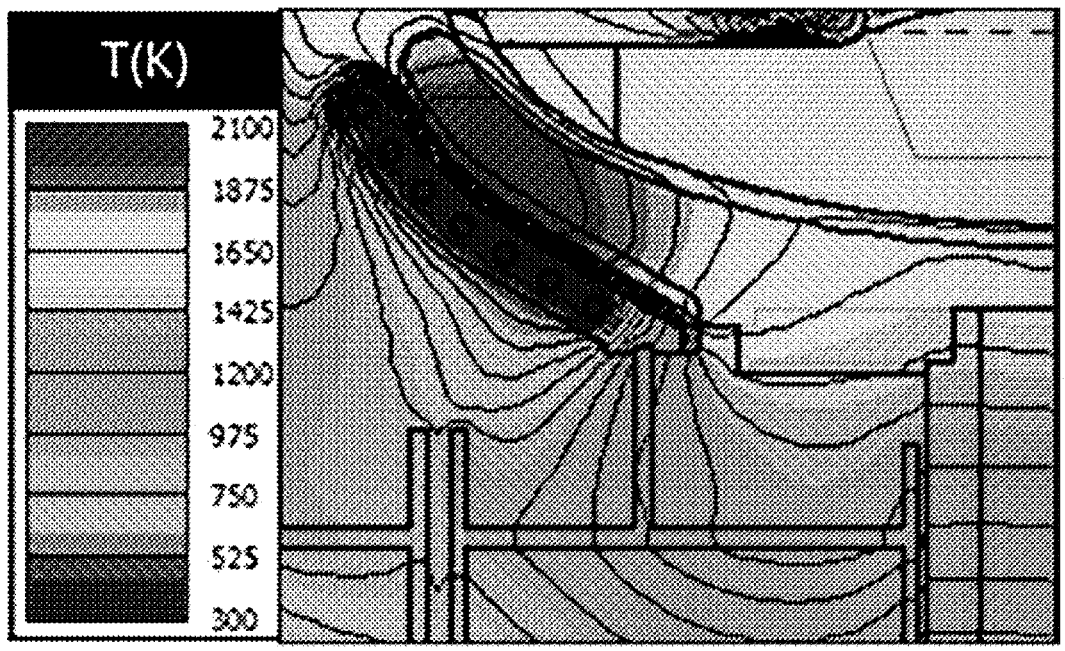
FIGS. 9 to 11 are diagrams showing the susceptor temperature and the ambient temperature of a susceptor according to the thickness of an insulation member through simulation.
Figure 10:
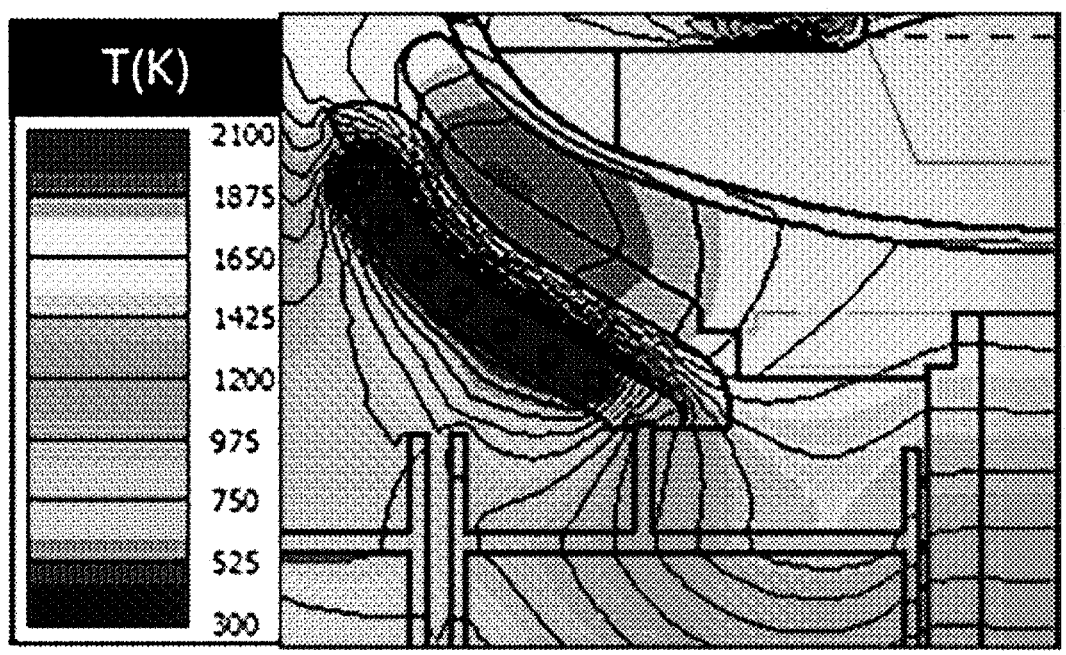
Figure 11:
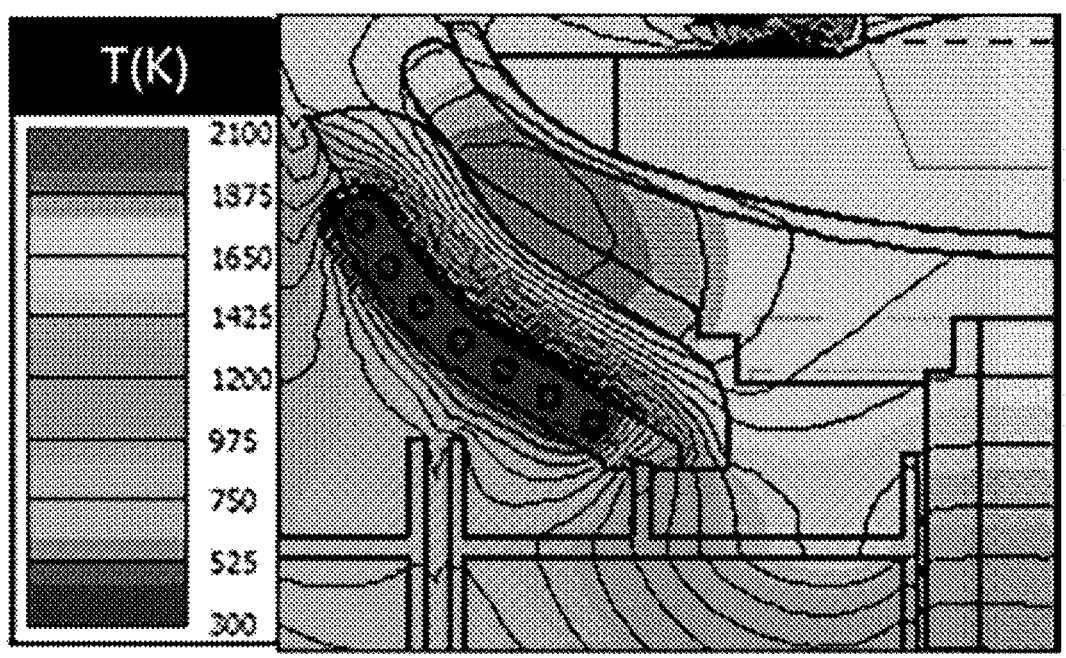

FIGS. 9 to 11 are diagrams showing the susceptor temperature and the ambient temperature of a susceptor according to the thickness of an insulation member through simulation.

The coil illustrated in FIG. 9 is disposed to be spaced apart from the susceptor by a fourth distance, the coil illustrated in FIG. 10 is disposed to be spaced apart from the susceptor by a fifth distance, and the coil illustrated in FIG. 11 is disposed to be spaced apart from the susceptor by a sixth distance. The fifth distance is longer than the fourth distance, and the sixth distance is longer than the fifth distance.

The thickness of the heat insulation member illustrated in FIG. 9 is 10 mm, the thickness of the heat insulation member illustrated in FIG. 10 is 30 mm, and the thickness of the heat insulation member illustrated in FIG. 11 is 50 mm.

In addition, the power energy for heating the susceptor illustrated in FIG. 9 is 65.76 kW, the power energy for heating the susceptor illustrated in FIG. 10 is 53.88 kW, and the power energy for heating the susceptor illustrated in FIG. 11. is 45.95 kW.

As shown in FIGS. 6 to 8, as the coil moves away from the susceptor, power energy for heating the susceptor increases, but as the thickness of the insulation member increases, power energy for heating the susceptor is reduced. That is, it can be seen that, in order to reduce the power energy for heating the susceptor, increasing the thickness of the heat insulation member is an important design consideration than increasing the distance between the coil and the susceptor.

Meanwhile, according to an exemplary embodiment of the present invention, the thickness of the heat insulation member may correspond to approximately twice the thickness of the susceptor. For example, when the thickness of the susceptor is 25 mm, the thickness of the heat insulation member is 50 mm. When the thickness of the heat insulation member is less than twice the thickness of the susceptor, the consumption of power energy is increased. Conversely, when the thickness of the heat insulation member is greater than twice the thickness of the susceptor, the consumption of power energy is not increased, but the cost of the heat insulation member is increased.

Figure 12:
FIG. 12 is a diagram showing the susceptor temperature and the ambient temperature of a susceptor through simulation, when a shield heat insulation member is disposed below the coil.
Figure 13:
FIG. 13 is a diagram showing the susceptor temperature and the ambient temperature of a susceptor through simulation, when a shield heat insulation member is not disposed below the coil.

FIG. 12 is a diagram showing the susceptor temperature and the ambient temperature of a susceptor through simulation, when a shield heat insulation member is disposed below the coil, and FIG. 13 is a diagram showing the susceptor temperature and the ambient temperature of a susceptor through simulation, when a shield heat insulation member is not disposed below the coil.

According to another exemplary embodiment of the present invention, as illustrated in FIG. 12, a shield heat insulation member 148 is provided on the lower side of the coil to block heat transfer.

The temperature of the susceptor and the ambient temperature of the susceptor when the shield heat insulation member 148 illustrated in FIG. 12 is disposed are higher than the temperature of the susceptor and the ambient temperature of the susceptor when the shield heat insulation member illustrated in FIG. 13 is not disposed.

In addition, the power energy for heating the susceptor illustrated in FIG. 12 is 45.98 kW, and the power energy for heating the susceptor illustrated in FIG. 13 is 49.75 kW. This is because the shield heat insulation member 148 blocks heat radiated from the susceptor. That is, the power energy for heating the susceptor when the shield heat insulation member 148 is disposed has the effect of saving approximately 7.6% compared to the power energy for heating the susceptor when the shield heat insulation member is not disposed.

Although the exemplary embodiments of the present invention have been described, the spirit of the present invention is not limited by the exemplary embodiments presented herein, and a person skilled in the art who understands the spirit of the present invention may easily suggest other exemplary embodiments by modifying, changing, deleting or adding components within the scope of the same spirit, but this will also be within the spirit of the present invention.

The invention claimed is:

1. An apparatus for growing an ingot, comprising:
a growth furnace having a main crucible which is disposed inside the growth furnace and in which molten silicon is held in order to grow the ingot;
a susceptor which is formed to surround an outer surface of the main crucible and heats the main crucible;
a heater which is formed to surround the outer surface of the susceptor and includes a coil which is supplied with power to generate a magnetic field and heats the susceptor by electromagnetic induction from the magnetic field; and
a heat insulation member which is disposed between the coil and the susceptor;
wherein the heat insulation member includes at least one cut-out area formed such that one side surface of the heat insulating member in a transverse direction, which is a circumferential direction of the heat insulation member when viewed from above, and the other side surface of the heat insulating member in the transverse direction of the heat insulation member are spaced apart from each other in the transverse direction; and
wherein a non-magnetic material is positioned between the one side surface of the heat insulating member and the other side surface of the heat insulation member to electrically insulate the two side surfaces from each other.

2. The apparatus of claim 1, wherein the heat insulation member is made of a plate-shaped member which is formed on an outer side surface of the susceptor, and wherein one side surface of the heat insulating member in the transverse direction and the other side surface of the heat insulating member in the transverse direction are disposed to one side of the outer side surface of the susceptor.

3. The apparatus of claim 1, wherein the heater further comprises a shield which is formed to surround an outer side surface of the coil and blocks exposure of the coil to an inside of the growth furnace.

4. The apparatus of claim 3, wherein the heat insulation member is disposed on an upper side surface of the shield and is formed to partially cover the upper side surface of the shield.

5. The apparatus of claim 3, wherein the shield is made of ceramic.

6. The apparatus of claim 1, wherein the heat insulation member is made of carbon fiber.

7. The apparatus of claim 1, further comprising:
a cover member which blocks exposure of the heat insulation member to an inside of the growth furnace.

8. The apparatus of claim 7, wherein the cover member is made of a ceramic material.

9. The apparatus of claim 7, wherein the cover member comprises at least one of alumina ($Al_2O_3$), zirconia ($ZrO_2$), silica ($SiO_2$) or silicon nitride ($Si_3N_4$).

10. The apparatus of claim 1, wherein the coil comprises a cooling pipe through which cooling water flows inside the coil.

11. The apparatus of claim 1, wherein a thickness of the heat insulation member corresponds to twice the thickness of the susceptor.

* * * * *